(12) United States Patent
Sadamitsu et al.

(10) Patent No.: US 8,252,404 B2
(45) Date of Patent: Aug. 28, 2012

(54) HIGH RESISTIVITY SILICON WAFERS

(75) Inventors: Shinsuke Sadamitsu, Tokyo (JP); Masataka Hourai, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 1952 days.

(21) Appl. No.: 10/985,880

(22) Filed: Nov. 12, 2004

(65) Prior Publication Data

US 2005/0103256 A1 May 19, 2005

(30) Foreign Application Priority Data

Nov. 13, 2003 (JP) ................................. 2003-384271

(51) Int. Cl.
*C30B 29/00* (2006.01)

(52) U.S. Cl. ............... 428/64.1; 423/324; 117/3; 117/2; 117/928; 117/930

(58) Field of Classification Search .................. 117/3, 2, 117/928, 930; 423/324; 428/64.1
See application file for complete search history.

(56) References Cited

U.S. PATENT DOCUMENTS

| | | | |
|---|---|---|---|
| 6,206,961 B1 * | 3/2001 | Takeno et al. | 117/20 |
| 6,663,708 B1 * | 12/2003 | Morita et al. | 117/3 |
| 2001/0029883 A1 * | 10/2001 | Minami et al. | 117/20 |
| 2003/0106482 A1 * | 6/2003 | Kononchuk et al. | 117/13 |
| 2003/0159650 A1 * | 8/2003 | Yang et al. | 117/89 |

FOREIGN PATENT DOCUMENTS

JP 2002-009081 1/2002

* cited by examiner

*Primary Examiner* — Matthew Song
(74) *Attorney, Agent, or Firm* — Clark & Brody

(57) ABSTRACT

Disclosed are high resistivity silicon wafers, wherein the interstitial oxygen concentration thereof is $8\times10^{17}$ atoms/cm$^3$ (ASTM F121-1979) or less, BMD (Bulk Micro Defect) density—oxygen precipitate within wafer—is $5\times10^7$ pieces/cm$^3$ or less, and an electric resistivity thereof is 100 Ω·cm or more. And further disclosed are high resistivity silicon wafers having an electric resistivity of 100 Ω·cm or more, which are cut from crystal region where no COP (Crystal Originated Particle) exist, and in which neither COP (Crystal Originated Particle) nor oxygen precipitate exist at the area from wafer surface to the depth of 5 μm or more owing to high temperature treatment. It is preferable that, in said high resistivity wafers, carbon concentration in wafers is $1\times10^{16}$ atoms/cm$^3$ or more (ASTM F123-1981), and/or nitrogen concentration is $1\times10^{13}$ atoms/cm$^3$ or more. Accordingly, high resistivity silicon wafers are provided, wherein the mechanical strength thereof is highly secured, and an excellent characteristic to slip generation is provided, so as to be optimal for base wafers of silicon wafers having a SOI structure or an epitaxial structure.

12 Claims, 2 Drawing Sheets

HIGH RESISTIVITY SILICON WAFERS

BACKGROUND OF THE INVENTION

1. Field of the Invention

The present invention relates to high resistivity silicon wafers for use of substrates of the high-frequency communication device and the like, in more particular relates to high resistivity silicon wafers for use of the base wafers of silicon wafers either having a silicon-on-insulator structure (SOI structure) or having an epitaxial structure, wherein mechanical properties are secured and the slip generation due to the heat treatment is suppressed, while no crystal originated particle (COP) exist therein.

2. Description of Related Arts

Since the high-frequency communication device for use of a near-field wireless LAN recently becomes common and/or gets micronized along with the growing number of signals, the demand for circuits commanding a high-frequency increases. And as high resistivity is required for substrates of high-frequency circuits, compound semiconductors such as GaAs and the like are conventionally used. However, substrates of compound semiconductors are very costly.

Meanwhile, in producing silicon single crystals by Czochralski method (referred to as "CZ method" hereinafter), raw materials are melted into molten liquid by using a quartz crucible and silicon single crystals are grown by directly pulling therefrom. Oxygen eluted from the quartz crucible while melting is resultantly contained in the crystal in supersaturated state. Consequently this oxygen contained in the crystal constitutes oxygen donors such as thermal donors and new donors in heat treatment step of device circuit fabrication process, and the resistivity of wafer is obliged to vary in device fabrication process.

Normally, in case of low resistivity wafers with about 10 $\Omega \cdot cm$ of resistivity, the amount of dopants are abundant enough in comparison with the amount of generated oxygen donors, thereby the influence to the resistivity by generation of oxygen donors is exerted slightly. On the other hand, in case of high resistivity wafers, the amount of dopants is small, thereby its resistivity is severely affected.

Especially, in case of p-type, the electric conductivity resulted from positive holes by acceptors disappears due to the supply of electrons by donors and the resistivity increases markedly, whilst, as donors increase, the conversion to n-type semiconductors takes place, leading to the reduction of its resistivity. In another word, in p-type wafers, as the increase of oxygen donors goes on, its resistivity becomes very high in an early stage but further increase of oxygen donors causes the conversion from p-type to n-type, resulting in large reduction of the resistivity.

The amount of generated oxygen donors in general comes to small in silicon wafers with lowered oxygen concentration. Accordingly, in order to reduce oxygen content, there are disclosed methods for producing single crystals with low oxygen such as the magnetic field applied Czochralski method (MCZ method), which is to apply the magnetic field to silicon molten liquid in the crucible and pull single crystals while controlling the flow thereof, and the method for using quartz crucible of which the inner surface is coated with SiC, and the like.

Furthermore, there is a proposed method that, by using silicon wafers with low oxygen concentration to be obtained by virtue of inhibiting the dissolution of oxygen, the formation of oxygen donors such as thermal donors and new donors is restricted.

For instance, in the semiconductor device proposed by Japanese Patent Application Publication No. 2002-9081 is applied the method to process circuits onto substrates in which the concentration of interstitial oxygen (Oi) is $8 \times 10^{17}$ $cm^{-3}$ or less, the density of Bulk Micro Defect (BMD) is $1 \times 10^8$ $cm^{-3}$ or more, and the specific resistance is 500 $\Omega \cdot cm$ or more.

However, in fabricating these low oxygen concentration silicon wafers to be obtained by virtue of inhibiting the dissolution of oxygen, there arises problems such that there is technically a limit to further lower oxygen content, the cost thereof increases and further the strength of wafers reduces with lower oxygen, resulting in likely causing defective products due to the deformation of wafers in device processing stage.

SUMMARY OF THE INVENTION

As aforementioned, by using silicon wafer with low oxygen concentration, it becomes possible to restrict the generation of oxygen donors, but there are problems such that, when oxygen concentration in high resistivity silicon wafers is reduced, mechanical strength is reduced, the slip is generated along with the decrease of strength in the area contacting with the boat during the heat treatment, and others.

Also, another factor affecting mechanical strength is oxygen precipitates which are called Bulk Micro Defect (BMD). When high density BMD is formed, mechanical strength is reduced, thereby there is an occasion that the slip generates numerously on whole surface of substrates due to thermal stress in device fabrication.

The present invention is achieved in view of such problems, and its object is: to provide high resistivity silicon wafers, which are low oxygen concentration silicon wafers that restrict the generation of oxygen donors in circuits processing heat treatment during device fabrication process: to provide the same of which mechanical strength is high, an excellent resistance to slip generation is provided, and further no crystal originated particle (COP) generates in crystals: and to provide the same which are optimal base wafers for silicon wafers having either a silicon-on-insulator structure (SOI structure) or an epitaxial structure.

The present inventors studied silicon wafers consisted of denuded zone where neither COP nor dislocation clusters exist in crystals, in order to make high resistivity silicon wafers. In single crystals grown by CZ method, defects referred to as COP and dislocation dusters are generated, which are not newly generated during heat treatment subsequent to pulling by CZ method but are built in crystals in growing step of single crystals, and hence are called as grown-in defects.

FIG. 1 is a schematic diagram which shows the representative distribution of grown-in defects built in crystal face in growing step of single crystals. The observation of grow-in defects distribution can be made as follows: the wafer is cut from a single crystal: Cu is deposited onto it by dipping it in aqueous copper nitrate solution: heat treatment follows: and X-ray topography method is applied.

Normally, in wafers cut from single crystals grown by CZ method, when subjected to heat treatment, a ring-like Oxidation-induced Stacking Fault (referred to as "OSF") generates in part of radial direction of crystals. The location where its ring pattern appears depends on the pulling speed of crystals, and physical properties at the outside and inside area of a ring-like OSF occurrence region differ from each other.

Namely, as shown in FIG. 1, in silicon wafers grown under normal conditions, the defect-free region is formed at the inside adjacent to a ring-like OSF occurrence region, and COP occurrence region follows it at further inner side. Meanwhile, at the outside of a ring-like OSF occurrence region, oxygen precipitation promoted region and oxygen precipitation inhibited region are formed in success, and the dislocation cluster defect occurrence region is located at the outermost.

The distribution of grown-in defects aforementioned is largely affected by pulling speed of single crystals in growing step of CZ method. That is, in case pulling speed is high, the area where a ring-like OSF occurrence region appears comes to locate at outer edge of single crystals, and as its speed decreases, the area where a ring-like OSF occurrence region appears comes to shrink from outer area toward inner area of crystals, resulting to disappear around central area of single crystals finally.

In distribution of grown-in defects in crystal face as shown in FIG. 1, no grown-in defects is discernible either at oxygen precipitation promoted region or at oxygen precipitation inhibited region, both of which exist at the outside of a ring-like OSF occurrence region. Therefore, the area ranging from the defect-free region existing at the inside of a ring-like OSF occurrence region to oxygen precipitation inhibiting region existing at the inside of the dislocation cluster defect occurrence region comes to be the denuded zone where neither COP nor dislocation cluster exist.

Thus, the attention is paid to the fact that it is effective in obtaining high resistivity silicon wafers free of COP in crystals that wafers are cut from the aforementioned denuded zone and mirror polished wafers are made. The present invention is made on the basis of aforementioned study and following description (1) to (5) is the gist of high resistivity silicon wafers thus invented.

(1) High resistivity silicon wafers, wherein the interstitial oxygen concentration thereof is $8 \times 10^{17}$ atoms/cm$^3$ (ASTM F121-1979) or less, BMD (Bulk Micro Defect) density—oxygen precipitate within wafer—is $5 \times 10^7$ pieces/cm$^3$ or less, and an electric resistivity thereof is 100 Ω·cm or more (referred to as "No. 1 high resistivity silicon wafers").

(2) High resistivity silicon wafers, wherein the interstitial oxygen concentration thereof is $8 \times 10^{17}$ atoms/cm$^3$ (ASTM F121-1979) or less and BMD (Bulk Micro Defect) density—oxygen precipitate within wafer—is $5 \times 10^7$ pieces/cm$^3$ or less, being cut from crystal region where no COP (Crystal Originated Particle) exist, and having an electric resistivity of 100 Ω·cm or more (referred to as "No. 2 high resistivity silicon wafers").

(3) High resistivity silicon wafers, wherein the interstitial oxygen concentration thereof is $8 \times 10^{17}$ atoms/cm$^3$ (ASTM F121-1979) or less, BMD (Bulk Micro Defect) density—oxygen precipitate within wafer—is $5 \times 10^7$ pieces/cm$^3$ or less, and neither COP (Crystal Originated Particle) nor oxygen precipitate exist at the area from wafer surface to the depth of 5 μm or more, having an electric resistivity of 100 Ω·cm or more (referred to as "No. 3 high resistivity silicon wafers").

(4) It is preferable that, in Nos. 1 to 3 high resistivity wafers aforementioned, carbon concentration thereof is $1 \times 10^{16}$ atoms/cm$^3$ or more (ASTM F123-1981), and/or nitrogen concentration thereof is $1 \times 10^{13}$ atoms/cm$^3$ or more.

(5) "Nos. 1 to 3 high resistivity wafers" aforementioned are used as base wafers of silicon wafers having either a SOI structure or an epitaxial structure.

DESCRIPTION OF PREFERRED EMBODIMENTS

"No. 1 high resistivity silicon wafers" according to the present invention are such that the interstitial oxygen concentration in wafer is $8 \times 10^{17}$ atoms/cm$^3$(ASTM F121-1979) or less, BMD (Bulk Micro Defect) density—oxygen precipitate within wafer—is $5 \times 10^7$ pieces/cm$^3$ or less, and its electric resistivity is 100 Ω·cm or more.

In silicon wafers which are aimed by the present invention, the frequency commanded by the device becomes high. In particular, when its frequency comes to exceed 1 GHz, the conventional substrates with low resistivity of 10 Ω·cm or less generate noises or cause the marked attenuation of signals. Thus, by increasing the electric resistivity to 100 Ω·cm or more, it becomes possible to solve these problems.

In "No. 1 high resistivity silicon wafers" according to the present invention, the reason why the interstitial oxygen concentration in wafers is specified to be $8 \times 10^{17}$ atoms/cm$^3$ (ASTM F121-1979) or less is such that, as an amount of generated oxygen donors comes to be small in silicon wafers with lowered oxygen concentration, oxygen donors generation during circuit processing heat treatment in device fabrication process is suppressed. Further, in order to extinguish COP while securing high resistivity for wafers, it is effective to keep it as low as specified value or less.

Furthermore, in "No. 1 high resistivity silicon wafers" according to the present invention, it is necessary for BMD (Bulk Micro Defect) density—oxygen precipitate within wafer—to be $5 \times 10^7$ pieces/cm$^3$ or less. By limiting oxygen precipitates to low, defects attributed to oxygen in wafer surface get reduced, which is advantageous in device fabrication process.

As the measuring method of BMD density, Wright etching method is applicable, which comprises 4 steps for instance.

No. 1 step: In dry oxygen atmosphere, the test sample of wafer is heat treated for evaluation with conditions of 700° C.×8 hours and 1000° C.×16 hours.

No. 2 step: The thermally oxidized film formed on the surface of the test sample of wafer due to the heat treatment for evaluation, is removed by an etchant which is made up with the mixing ratio as HF:H$_2$O=1:1.

No. 3 step: After having test sample of wafer cracked in cleavage failure manner, the selective etching shall be carried out to elucidate oxygen precipitates. Here, the mixing ratio of an etchant for selective etching is given as HF:HNO$_3$:CrO$_3$: Cu(NO$_3$)$_2$:H$_2$O:CH$_3$COOH=1200 cc:600 cc:250 g:40 g:1700 cc 1200 cc, and the depth of etching is 5 μm in wafer cleavage plane.

No. 4 step: After selective etching, the etch pit density in wafer cleavage plane is measured by optical microscope to read BMD density (pieces/cm$^3$).

Figure 1:
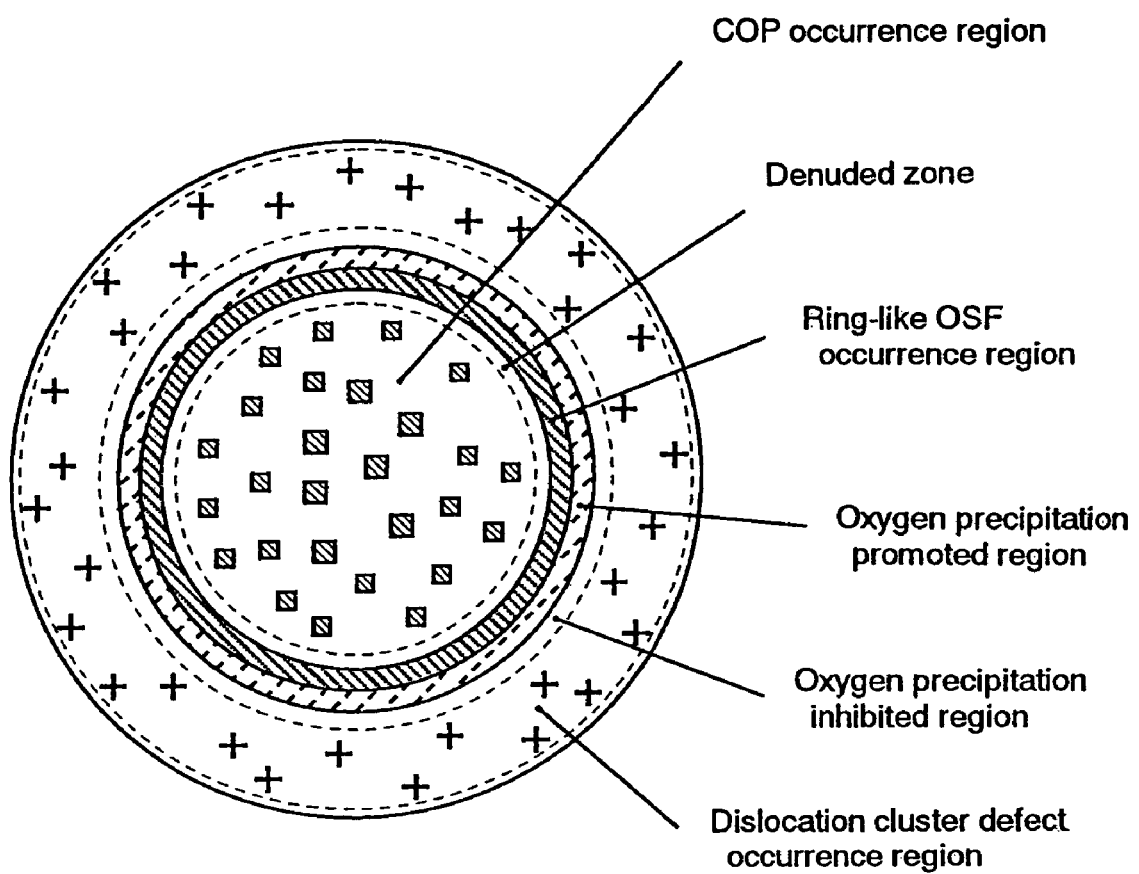
FIG. 1 is a schematic diagram to show the representative distribution of grown-in defects which are formed in crystal face in the growing step of single crystals.

"No. 2 high resistivity silicon wafers" according to the present invention, as shown in FIG. 1 aforementioned, are to be cut from denuded zone ranging from the defect-free zone, which is formed at the inside of a ring-like OSF occurrence region, to the oxygen precipitation inhibited region which locates at the inside of the dislocation cluster defect occurrence region, wherein no COP exists at either location.

As the method for measuring COP density, Light scattering method—utilizing a light beam of the wave length so as to penetrate into the depth of 5 μm or so below the wafer surface—can be applied.

"No. 3 high resistivity silicon wafers" according to the present invention are constituted so as to be cut from single silicon crystal ingots which have 100 Ω·cm or more of electric resistivity and the interstitial oxygen concentration in wafers is $8 \times 10^{17}$ atoms/cm$^3$ (ASTM F121-1979) or less, and are also constituted so as to contain neither COP nor oxygen precipitates at the range from wafer surface to the depth of 5 μm or more by following steps in case of the presence of COP in wafer: the mirror wafers are prepared: and high temperature heat treatment is applied thereto in order to remove COP from wafer surface layer to be used for device application.

To be concrete, in the atmosphere of argon, hydrogen, mixed gas thereof, or nitrogen mixed with a slight of oxygen, the oxygen outward diffusion treatment at a high temperature with duration of 1 hour or more is performed. It is possible, by heating to the high temperature even in the atmosphere containing oxygen or oxygen bearing gas, to complete the oxygen outward diffusion treatment. However, by applying non-oxidizing or weak oxidizing atmosphere, the partial pressure of oxygen in the vicinity of surface can be lowered and the release speed of oxygen is increased. Thus, by heating to the high temperature in such non-oxidizing atmosphere, it becomes possible to extinguish defects such as COP, oxygen precipitates and the like in the vicinity of wafer surface layer.

As carbon, which is electrically neutral, is effective to promote the formation of oxygen precipitates which play a role of gettering, and is effective to keep the strength when the concentration of interstitial oxygen (soluble oxygen) is low and thereby the wafer strength is reduced, it is allowed for carbon in wafers to be contained with the concentration of $1 \times 10^{16}$ atoms/cm$^3$ (ASTM F123-1981) or more. Thus, the mechanical strength can be enhanced, and thereby the slip generation associated with heat treatment can be suppressed.

Figure 2:
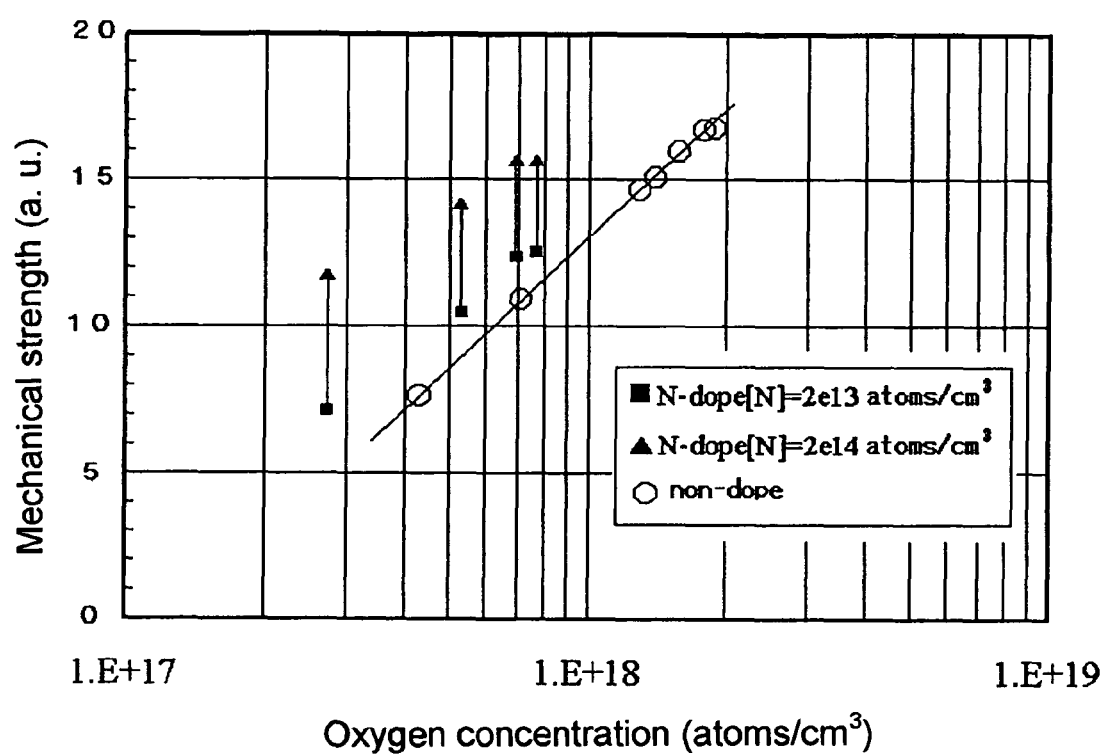
FIG. 2 is a diagram to show the relationship between nitrogen concentration and mechanical strength as oxygen concentration varies.

FIG. 2 is a diagram to show the relationship between the nitrogen concentration and the mechanical strength as the oxygen concentration in wafers varies. According to this diagram, it is obvious that, when the nitrogen concentration in wafers is $1 \times 10^{13}$ atoms/cm$^3$ or more, the high mechanical strength can be secured.

Accordingly, as nitrogen, similarly to carbon, is effective to promote the formation of oxygen precipitates, and to maintain the strength when the concentration of the interstitial oxygen (dissolved oxygen) is low and thereby the strength of wafers decreases, it is allowed for nitrogen to be contained with the concentration of $1 \times 10^{13}$ atoms/cm$^3$ or more. Thus, the mechanical strength can be enhanced, and thereby the slip generation associated with heat treatment can be suppressed.

"Nos. 1 to 3 high resistivity silicon wafers" according to the present invention can be used as the base wafers having a SOI structure. That is, producing SIMOX-type SOI wafers or laminated-type SOI wafers by using high resistivity silicon wafers thus obtained as the base wafers, can be best fit, for instance, to SOI wafers for mobile communication application.

Since the production parameters of SOI wafers by SIMOX Method are not particularly limited other than that high resistivity silicon wafers according to the present invention must be used, it is allowable for the conventional parameters to be applied. That is, although the accelerating voltage of 180 keV to 200 keV as the parameter for oxygen infiltration is generally applied in producing SIMOX-type, either higher or lower voltage than this band can be applied.

Although it is preferable that dose rate of oxygen ion to be used is around $4 \times 10^{17}$ cm$^{-2}$ or not less than $1.0 \times 10^{18}$ cm$^{-2}$, the dose rate other than this range can be applied. As an anneal condition, it is preferable that the temperature not less than 1300° C. is adopted in order to obtain robust embedded oxide film, but the lower temperature than this is also allowable. As the atmosphere for annealing, either oxidizing or non-oxidizing one can be used.

Meanwhile, regarding production parameters of laminated-type SOI wafers, it is not necessary to provide particular limitation so that high resistivity silicon wafers according to the present invention have only to be used. To be concrete, it is constituted to pick up another common silicon wafer as the active layer side wafer, and provide said active layer side wafer and/or the base wafer with the heat treatment at 1000° C. or higher to form thermally oxidized film on wafer surface thereof.

Next, after making the active layer side wafer contact closely with the base wafer, the heat treatment is provided to strongly bond the active layer side wafer with the base wafer, resulting to be the laminated wafer. As the heat treatment condition to perform bonding of relevant wafer, it is adequate enough to carry out heating in oxygen or steam bearing atmosphere at 400 to 1200° C.

It is more preferable to perform the heat treatment at 900° C., thereby two layers of the wafer are made to bond more strongly while, in producing SOI wafers with thick film, it is preferable to also apply high resistivity silicon wafers obtained according to the present invention for the active layer side wafers in place of common silicon wafer.

"Nos. 1 to 3 high resistivity silicon wafers" according to the present invention can be used as the base wafers having an epitaxial structure. That is, it becomes possible to produce epitaxial wafers by forming an epitaxial layer onto the obtained high resistivity silicon wafers. Thus, when epitaxial wafers are produced by forming an epitaxial layer onto high resistivity silicon wafers which are made according to the present inventive method, an excellent feature is combined such that, for instance, an optimal wafers in place of SOI wafers for mobile communication application can be provided.

Regarding production parameters for epitaxial wafers, it is not necessary to provide particular limitation so that high resistivity silicon wafers according to the present invention have only to be used, whilst it is adequate enough to adopt usual parameters. In producing epitaxial wafers, the epitaxial growing apparatus to be used can be either barrel type, pancake type, single-wafer type or the like, which is widely known as epitaxial growing apparatus, thereby the epitaxial method known widely also can be applied.

EXAMPLES

Example 1

A silicon single crystal with the electric resistivity of 2000 Ω·cm is grown by MCZ method in using high purity synthesis quartz crucible, wherein the initial oxygen concentration is $6 \times 10^{17}$ atoms/cm$^3$ (ASTM F121-1979). From the grown single crystal, a mirror wafer having BMD density—oxygen precipitates within wafer, and can be detected by Wright etching method—of $5 \times 10^7$ pieces/cm$^3$ or less is prepared. The mirror wafer thus obtained is subjected to the heat treatment of 450° C.×16 hours for forming oxygen donors, and undergoes measuring wafer resistivity, which turns out to be kept as 2000 Ω·cm as it is. When the initial oxygen concentration comes to exceed $8 \times 10^{17}$ atoms/cm$^3$ (ASTM F121-1979), the effect by oxygen donors becomes prominent, thereby the alteration of the resistivity thereof generates.

Further, when BMD density—oxygen precipitates within wafer—comes to exceed $5 \times 10^7$ pieces/cm$^3$, defects attributable to oxygen in wafer surface increase, resulting in undesirable poor yield in device fabrication.

Example 2

Similarly to Example 1, a silicon single crystal with the electric resistivity of 2000Ω·cm is grown by MCZ method in using high purity synthesis quartz crucible, wherein the initial oxygen concentration is $6 \times 10^{17}$ atoms/cm$^3$ (ASTM F121-1979). Where, the used pulling speed is designated by V (mm/min), and the temperature gradient in normal direction to the boundary surface where silicon molten liquid contacts with the ingot of said single crystal is designated by G (° C./mm), V/G is adjusted so that the ingot of silicon single crystal is grown, wherein a ring of OSF generation zone diminishes around the central portion of a single crystal and the whole area thereof in radial direction comprises oxygen precipitation promoted region. And then, a wafer is cut from said single crystal ingot and the mirror wafer according to the present invention is made.

The mirror wafer thus obtained is subjected to the measurements of COP density and BMD density, and undergoes the heat treatment for forming oxygen donors along with subsequent measurement of electrical resistivity. Consequently, it turns out to be that no COP is observed, BMD density is $5 \times 10^7$ pieces/cm$^3$ or less, and the resistivity is kept as 2000 Ω·cm as it is.

Example 3

Similarly to Example 1, a silicon single crystal with the electric resistivity of 2000Ω·cm is grown by MCZ Method in using high purity synthesis quartz crucible, wherein the initial oxygen concentration is $6 \times 10^{17}$ atoms/cm$^3$ (ASTM F121-1979). From the grown single crystal, a mirror wafer having BMD density—oxygen precipitates within wafer, and can be detected by Wright Etching Method—of $5 \times 10^7$ pieces/cm$^3$ or less is prepared. The mirror wafer thus obtained is subjected to the heat treatment of 1200° C.×1 hour in argon atmosphere in order to remove COP from wafer surface layer which is to be used for device application.

Similarly to Example 2, the mirror wafer thus obtained is subjected to the measurements of COP density and BMD density, and undergoes the heat treatment for forming oxygen donors along with subsequent measurement of electrical resistivity. Consequently, it turns out to be that no COP is observed, BMD density is $5 \times 10^7$ pieces/cm$^3$ or less, and the resistivity is kept as 2000 Ω·cm as it is.

Example 4

A silicon single crystal with the electric resistivity of 2000 Ω·cm is grown by MCZ Method in using high purity synthesis quartz crucible, wherein the initial oxygen concentration is $6 \times 10^{17}$ atoms/cm$^3$ (ASTM F121-1979) and carbon concentration is $1 \times 10^{16}$ atoms/cm$^3$ (ASTM F123-1981).

Where, the used pulling speed is designated by V (mm/min), and the temperature gradient in normal direction to the boundary surface where silicon molten liquid contacts with the ingot of said single crystal is designated by G (° C./mm), V/G is adjusted so that the ingot of silicon single crystal is grown, wherein a ring of OSF generation zone diminishes around the central portion of a single crystal and the whole area thereof in radial direction comprises oxygen precipitation promoted region. And then, wafer is sliced out of said single crystal ingot and the mirror wafer according to the present invention is made.

The mirror wafer thus obtained, similarly to Example 2, is subjected to the measurements of COP density and BMD density, and undergoes the heat treatment for forming oxygen donors along with subsequent measurement of electrical resistivity. Consequently, it turns out to be that no COP is observed, BMD density is $5 \times 10^7$ pieces/cm$^3$ or less, the resistivity is kept as 2000 Ω·cm as it is, and no slip is generated.

Example 5

A silicon single crystal with the electric resistivity of 2000 Ω·cm is grown by MCZ Method in using high purity synthesis quartz crucible, wherein the initial oxygen concentration is $6 \times 10^{17}$ atoms/cm$^3$ (ASTM F121-1979) and nitrogen concentration is $1 \times 10^{13}$ atoms/cm$^3$.

Where, the used pulling speed is designated by V (mm/min), and the temperature gradient in normal direction to the boundary surface where silicon molten liquid contacts with the ingot of said single crystal is designated by G (° C./mm), V/G is adjusted so that the ingot of silicon single crystal is grown, wherein a ring of OSF generation zone diminishes around the central portion of a single crystal and the whole area thereof in radial direction comprises oxygen precipitation promoted region. And then, wafer is sliced out of said single crystal ingot and the mirror wafer according to the present invention is made.

The mirror wafer thus obtained, similarly to Example 2, is subjected to the measurements of COP density and BMD density, and undergoes the heat treatment for forming oxygen donors along with subsequent measurement of electrical resistivity. Consequently, it turns out to be that no COP is observed, BMD density is $5 \times 10^7$ pieces/cm$^3$ or less, the resistivity is kept as 2000 Ω·cm as it is, and no slip is generated.

What is claimed is:

1. High resistivity silicon wafers, wherein the interstitial oxygen concentration in wafer is $8 \times 10^{17}$ atoms/cm$^3$ (ASTM F121-1979) or less and BMD (Bulk Micro Defect) density—oxygen precipitate within wafer—is $5 \times 10^7$ pieces/cm$^3$ or less, being cut from crystal region where no COP (Crystal Originated Particle) exist, and having an electric resistivity of 100 Ω·cm or more.

2. High resistivity silicon wafers according to claim 1, wherein carbon concentration in wafers is $1 \times 10^{16}$ atoms/cm$^3$ or more (ASTM F123-1981).

3. High resistivity silicon wafers according to claim 1, wherein nitrogen concentration is $1 \times 10^{13}$ atoms/cm$^3$ or more.

4. High resistivity silicon wafers according to claim 1, wherein carbon concentration in wafers is $1 \times 10^{16}$ atoms/cm$^3$ or more (ASTM F123-1981), and nitrogen concentration is $1 \times 10^{13}$ atoms/cm$^3$ or more.

5. High resistivity silicon wafers according to claim 1, which are used as base wafers, having a SOI structure.

6. High resistivity silicon wafers according to claim 1, which are used as base wafers, having an epitaxial structure.

7. High resistivity silicon wafers, wherein the interstitial oxygen concentration in wafer is $8 \times 10^{17}$ atoms/cm$^3$ (ASTM F121-1979) or less, BMD (Bulk Micro Defect) density—oxygen precipitate within wafer—is $5 \times 10^7$ pieces/cm$^3$ or less, and neither COP (Crystal Originated Particle) nor oxygen precipitate exist at the area from wafer surface to the depth of 5 μm or more, having an electric resistivity of 100 Ω·cm or more.

8. High resistivity silicon wafers according to claim 7, wherein carbon concentration in wafers is $1 \times 10^{16}$ atoms/cm$^3$ or more (ASTM F123-1981).

9. High resistivity silicon wafers according to claim 7, wherein nitrogen concentration is $1 \times 10^{13}$ atoms/cm$^3$ or more.

10. High resistivity silicon wafers according to claim 7, wherein carbon concentration in wafers is $1 \times 10^{16}$ atoms/cm$^3$ or more (ASTM F123-1981), and nitrogen concentration is $1 \times 10^{13}$ atoms/cm$^3$ or more.

11. High resistivity silicon wafers according to claim 7, which are used as base wafers, having a SOI structure.

12. High resistivity silicon wafers according to claim 7, which are used as base wafers, having an epitaxial structure.

* * * * *